US012670952B2

(12) United States Patent
Bedeschi et al.

(10) Patent No.: US 12,670,952 B2
(45) Date of Patent: Jun. 30, 2026

(54) CURRENT REFERENCES FOR MEMORY CELLS

(71) Applicant: Micron Technology, Inc., Boise, ID (US)

(72) Inventors: Ferdinando Bedeschi, Biassono (IT); Pierguido Garofalo, San Donato (IT); Umberto Di Vincenzo, Capriate San Gervasio (IT); Claudia Palattella, Cologno Monzese (IT)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 18/590,692

(22) Filed: Feb. 28, 2024

(65) Prior Publication Data

US 2024/0203490 A1 Jun. 20, 2024

Related U.S. Application Data

(63) Continuation of application No. 17/720,957, filed on Apr. 14, 2022, now Pat. No. 11,942,151.

(51) Int. Cl.
G11C 13/00 (2006.01)

(52) U.S. Cl.
CPC .... G11C 13/004 (2013.01); *G11C 2013/0054* (2013.01)

(58) Field of Classification Search
CPC .. G11C 13/004; G11C 13/002; G11C 13/0004
See application file for complete search history.

(56) References Cited

U.S. PATENT DOCUMENTS

| | | | | |
|---|---|---|---|---|
| 2004/0022097 A1* | 2/2004 | Cho | | G11C 11/16 |
| | | | | 365/200 |
| 2006/0221678 A1* | 10/2006 | Bedeschi | | G11C 13/004 |
| | | | | 365/163 |
| 2009/0027953 A1* | 1/2009 | Kang | | G11C 13/0026 |
| | | | | 365/210.1 |
| 2020/0013467 A1 | 1/2020 | Yamada | | |
| 2021/0328142 A1 | 10/2021 | Pirovano et al. | | |

(Continued)

OTHER PUBLICATIONS

Huang, Chi-Hsin, et al., "Self-Selecting Resistive Switching Scheme Using TiO2 Nanorod Arrays", Scientific Reports 7:2066, (May 18, 2017), 9 pgs.

*Primary Examiner* — Han Yang
(74) *Attorney, Agent, or Firm* — Schwegman Lundberg & Woessner, P.A.

(57) ABSTRACT

A variety of applications can include one or more memory devices having one or more memory arrays of memory cells, where each memory cell is a resistive memory cell arranged such that a clamp current for the memory cell can be provided by an access line biasing circuit to the memory cell opposite a coupling of a sense circuit to a digit line to the memory array. The access line biasing circuit and the sense circuit can be operated in a digit line precharge phase and an access line biasing phase of a memory cell of the memory array using a set of switches to control activities for the memory cell in the memory array, the sense circuit, and the access line biasing circuit. A reference current can be provided from the access line biasing circuit to the sense circuit. Additional devices, systems, and methods are discussed.

20 Claims, 12 Drawing Sheets

(56)     References Cited

U.S. PATENT DOCUMENTS

| | | |
|---|---|---|
| 2022/0013167 A1 | 1/2022 | Robustelli et al. |
| 2022/0036946 A1 | 2/2022 | Redaelli et al. |
| 2022/0180944 A1 | 6/2022 | Rana et al. |
| 2023/0005536 A1 | 1/2023 | Artur et al. |
| 2023/0335191 A1 | 10/2023 | Bedeschi et al. |

* cited by examiner

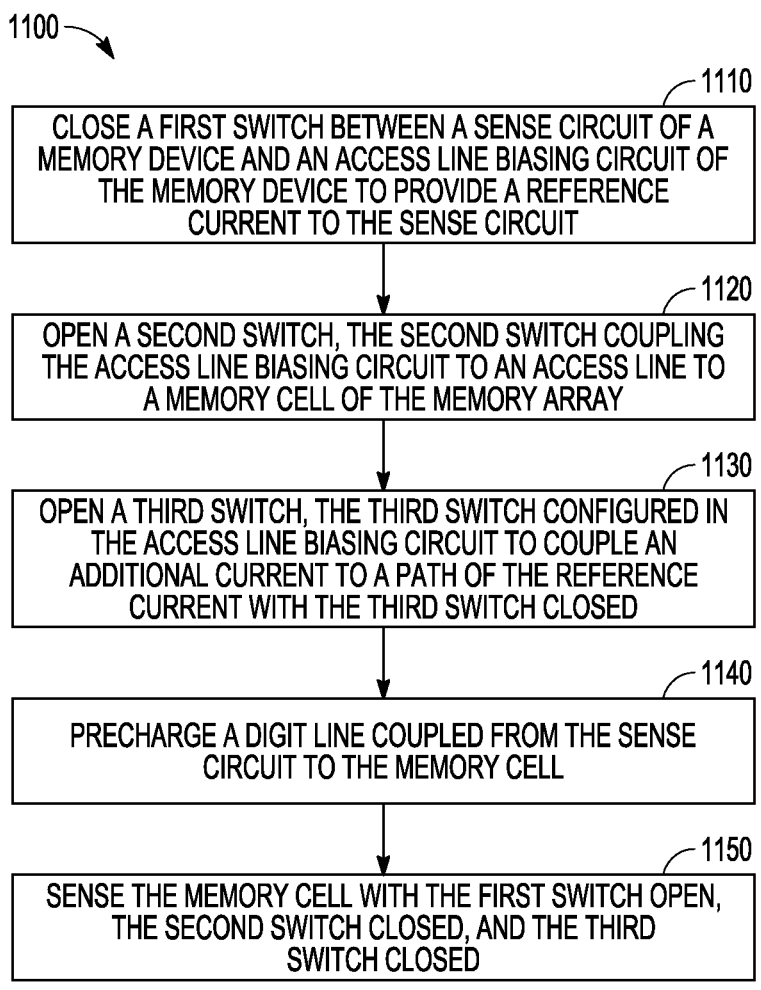

1100 ⟍

┌─────────────────────────────────────────────────────────┐ ⟋1110
│ CLOSE A FIRST SWITCH BETWEEN A SENSE CIRCUIT OF A          │
│ MEMORY DEVICE AND AN ACCESS LINE BIASING CIRCUIT OF        │
│ THE MEMORY DEVICE TO PROVIDE A REFERENCE                   │
│ CURRENT TO THE SENSE CIRCUIT                               │
└─────────────────────────────────────────────────────────┘

┌─────────────────────────────────────────────────────────┐ ⟋1120
│ OPEN A SECOND SWITCH, THE SECOND SWITCH COUPLING          │
│ THE ACCESS LINE BIASING CIRCUIT TO AN ACCESS LINE TO      │
│ A MEMORY CELL OF THE MEMORY ARRAY                         │
└─────────────────────────────────────────────────────────┘

┌─────────────────────────────────────────────────────────┐ ⟋1130
│ OPEN A THIRD SWITCH, THE THIRD SWITCH CONFIGURED IN       │
│ THE ACCESS LINE BIASING CIRCUIT TO COUPLE AN              │
│ ADDITIONAL CURRENT TO A PATH OF THE REFERENCE             │
│ CURRENT WITH THE THIRD SWITCH CLOSED                      │
└─────────────────────────────────────────────────────────┘

┌─────────────────────────────────────────────────────────┐ ⟋1140
│ PRECHARGE A DIGIT LINE COUPLED FROM THE SENSE             │
│ CIRCUIT TO THE MEMORY CELL                               │
└─────────────────────────────────────────────────────────┘

┌─────────────────────────────────────────────────────────┐ ⟋1150
│ SENSE THE MEMORY CELL WITH THE FIRST SWITCH OPEN,         │
│ THE SECOND SWITCH CLOSED, AND THE THIRD                   │
│ SWITCH CLOSED                                             │
└─────────────────────────────────────────────────────────┘

FIG. 11

CURRENT REFERENCES FOR MEMORY CELLS

PRIORITY APPLICATION

This application is a continuation of U.S. application Ser. No. 17/720,957, filed 14 Apr. 2022, which is incorporated herein by reference in its entirety.

FIELD OF THE DISCLOSURE

Embodiments of the disclosure relate generally to circuits, and more specifically, to circuits in memory systems.

BACKGROUND

Memory devices are typically provided as internal, semiconductor, integrated circuits in computers or other electronic devices. There are many different types of memory, including volatile and non-volatile memory. Volatile memory requires power to maintain its data and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Access to data in memory cells of a memory device can be performed by operations on the memory cells with the memory cells typically addressed, at least logically, in a memory array as a matrix arrangement. Data can be input and output via digit lines, for example bit lines, to memory cells that are selected for the data using access lines, for example word lines. Enhancements to accessing memory cells of a memory array may provide improvements to the operating characteristics of the memory device containing the memory cells.

BRIEF DESCRIPTION OF THE DRAWINGS

The drawings, which are not necessarily drawn to scale, illustrate generally, by way of example, but not by way of limitation, various embodiments discussed in the present document.

FIG. 11 is a flow diagram of features of an example of a method of performing a read operation of a memory device having a memory array of resistive memory cells, according to various embodiments.

DETAILED DESCRIPTION

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
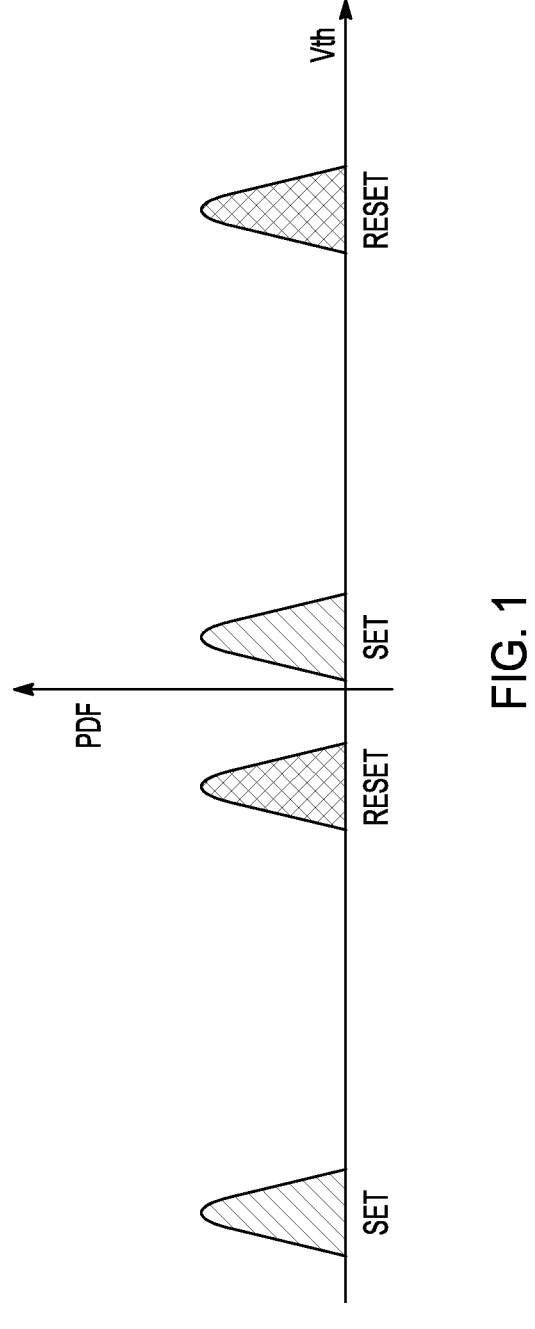
FIG. 1 is a representation of a probability distribution as a function of the set state and the reset state of a self-selecting memory cell, according to various embodiments.

Resistive memory cells can be realized in a number of formats, which can include current flows in a material for different states of data storage in a memory cell such as a self-selecting memory (SSM) cell. An example of a basic SSM cell is a cell having two terminals that can conduct current in a high current conduction state when an applied voltage across the two terminals is greater that a threshold voltage Vth. The high current conduction state is relative to a lower conduction state when the applied voltage is less than Vth. The two states are referred to as the set state and the reset state. FIG. 1 is a representation of a probability distribution as a function of the set state and the reset state of a SSM cell. On the threshold axes, the threshold of the self-selecting memory cell depends on the data stored by the memory cell. On the positive axes, the reset state has a high Vth and the set state has a low Vth; on the negative axes, the reset state has a low magnitude Vth and the set state has a high magnitude Vth. A threshold voltage can be set to store a bit of data. In some embodiments, a number of threshold voltages, such as two or more Vths of the self-selecting memory cell, may be set to store one or more bits of data. Self-selecting memory cells can be disposed in a number of architectures, for example in a planar structure or in a vertical structure.

Figure 2:
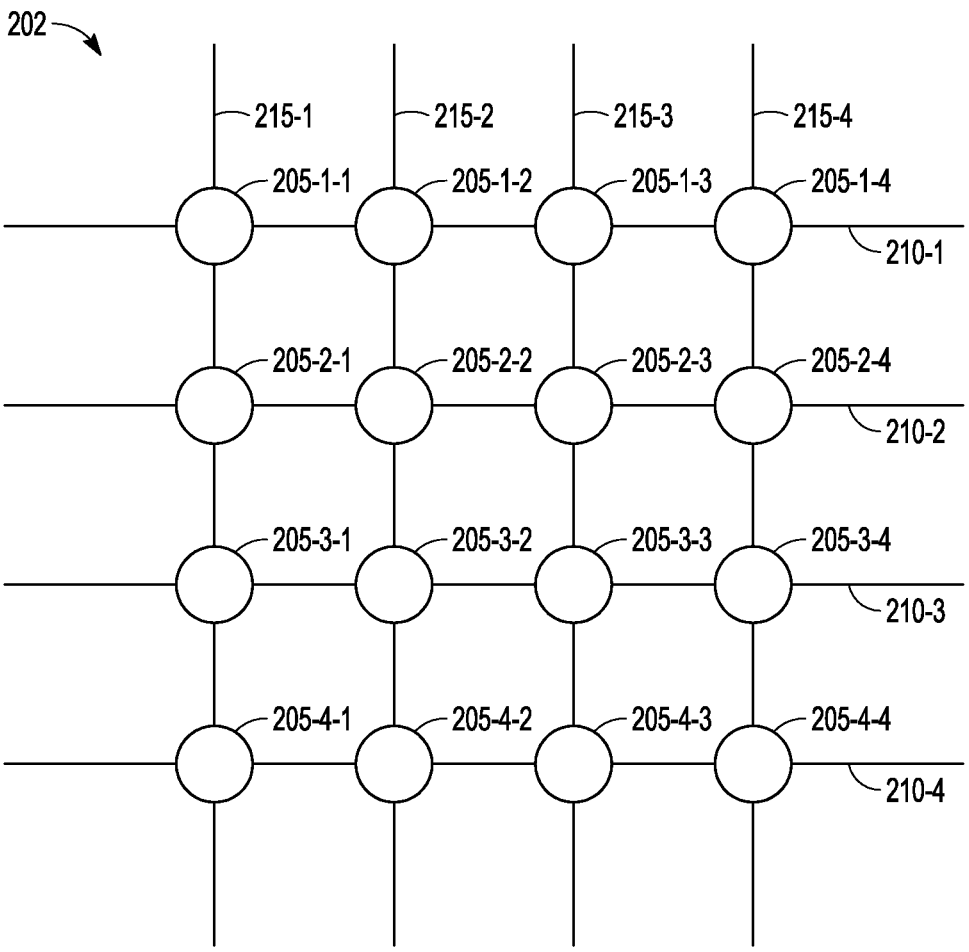
FIG. 2 illustrates an array of self-selecting memory cells in a planar structure, according to various embodiments.

FIG. 2 illustrates an array 202 of SSM cells 205-1-1 . . . 205-1-4, 205-2-1 . . . 205-2-4, 205-3-1 . . . 205-3-4, and 205-4-1 . . . 205-4-4 in a planar structure. Though four rows of four SSM cells are shown, array 202 can have more or less than four rows of four SSM cells. Array 202 is coupled to access lines 210-1, 210-2, 210-3 and 210-4 and digit lines 215-1, 215-2, 215-3 and 215-4. Though four access lines and four digit lines are shown, array 202 can be coupled to less or more than four access lines and four digit lines, depending on the number of SSM cells in the array. Each of these memory cells is coupled to a unique pair of a digit line and an access line to be addressed as a memory cell. For example, SSM cell 205-1-2 is coupled to access line 210-1 and digit line 215-2. Though SSM cells 205-1-1, 205-1-3, and 205-1-4 are also coupled to access line 210-1, these SSM cells are not coupled to digit line 215-2. Though SSM cells 205-2-2, 205-3-2, and 205-4-2 are also coupled to digit line 215-2, these SSM cells are not coupled to access line 210-1.

Figure 3:
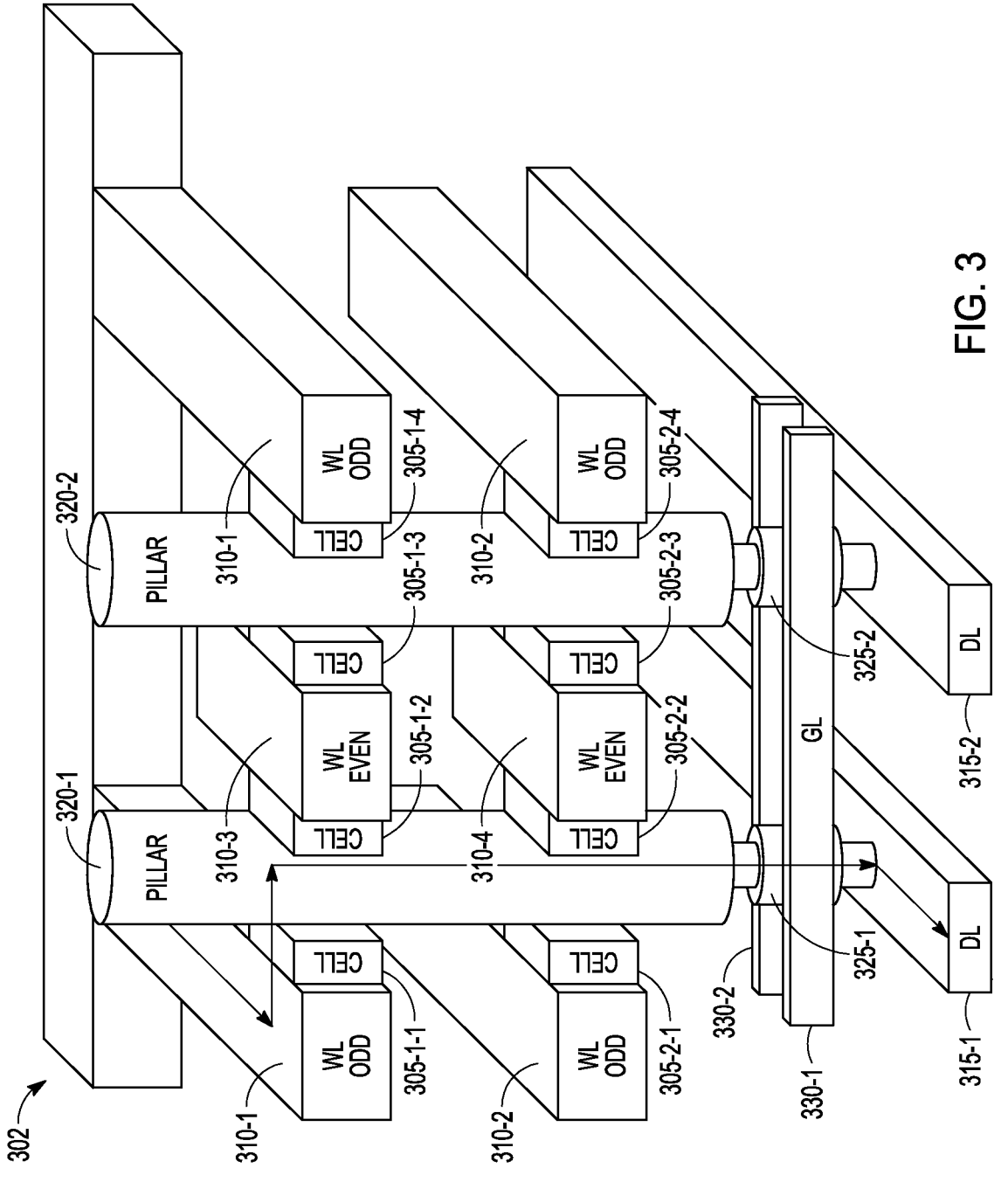
FIG. 3 illustrates an array of self-selecting memory cells in a vertical structure, according to various embodiments.

FIG. 3 illustrates an array 302 of SSM cells 305-1-1, 305-1-2, 305-1-3, 305-1-4, 305-2-1, 305-2-2, 305-2-3, and 305-2-4 in a vertical structure. The vertical structure of memory array 302 is shown with two levels of SSM cells, though such vertical memory arrays can have more than two levels. SSM cells 305-1-1, 305-1-2, 305-1-3, 305-1-4 can be arranged on a first level that also includes access lines that can be arranged as odd access line 310-1 and even access line 310-3. SSM cell 305-1-1 is coupled between odd access line 310-1 and conductive pillar 320-1. SSM cell 305-1-2 is coupled between even access line 310-3 and conductive pillar 320-1. SSM cell 305-1-3 is coupled between even access line 310-3 and conductive pillar 320-2. SSM cell 305-1-4 is coupled between odd access line 310-1 and conductive pillar 320-2.

SSM cells 305-2-1, 305-2-2, 305-2-3, 305-2-4 can be arranged on a second level that also includes access lines that can be arranged as odd access line 310-2 and even access line 310-4. SSM cell 305-2-1 is coupled between odd access line 310-2 and conductive pillar 320-1. SSM cell 305-2-2 is coupled between even access line 310-4 and conductive pillar 320-1. SSM cell 305-2-3 is coupled between even access line 310-4 and conductive pillar 320-2. SSM cell 305-2-4 is coupled between odd access line 310-2 and conductive pillar 320-2.

Conductive pillar 320-1 can be operatively coupled to a digit line 315-1 by a selector device 325-1, which are coupled to global access lines 330-1 and 330-2 for operation with even and odd access lines. Conductive pillar 320-2 can be operatively coupled to a digit line 315-2 by a selector device 325-2, which are coupled to global access lines 330-1 and 330-2 for operation with even and odd access lines. Each of the SSM cells is coupled to a unique pair of a digit line and an access line to be addressed as a memory cell. SSM cells 305-1-1, 305-1-2, 305-1-3, and 305-1-4 of the first level are coupled to pairs (access line 310-1, digit line 315-1), (access line 310-3, digit line 315-1), (access line 310-3, digit line 315-2), and (access line 310-1, digit line 315-2), respectively. SSM cells 305-2-1, 305-2-2, 305-2-3, and 305-2-4 of the second level are coupled to pairs (access line 310-2, digit line 315-1), (access line 310-4, digit line 315-1), (access line 310-4, digit line 315-2), and (access line 310-4, digit line 315-2), respectively.

In various embodiments, a SSM cell uses a limited current flow during read to reduce the stress. This limited current is referred to, herein, as Iclamp and limits the maximum current flow in the SSM cell. When the SSM cell snaps, that is, enters its high conduction state, the maximum current in the SSM cell can be limited to Iclamp by an access line bias circuit, even if the cell could drive a higher current. The set cell current can be defined as set cell current=Iclamp, which is current seen by a sense circuit when the SSM cell switches or the maximum current allowed by the clamp of the access line bias circuit. The reset cell current can be defined as reset cell current=Ileakage, which is current seen by the sense circuit when the SSM cell does not switch. When the SSM cell snaps happen, the cell current Icell can be compared with a reference current Iref. A best choice for Iref can be appropriately Iclamp/2. Given these currents, the margins for distribution for the set state and the reset state depends on Iref, Ileak and Iclamp distribution widths. The margin for the set state can be defined as Mset=I(set cell)−Iref=Iclamp/2, and the margin for the reset state can be defined as Mreset=Iref−I(reset cell)=Iclamp/2-Ileak. Improving generation of Iref and leakage compensation can decrease the bit error rate (BER).

Part of a misalignment between the two margins Mset and Mreset is due to a leakage current contribution, which is Ileak. Margin detractors occur when the Iref variation and the Iclamp variation are uncorrelated, which can result if Iref and Iclamp are obtained with two different references through two different paths. This produces an uncertainty that will enlarge the distributions for set and reset. In addition, the occurrence of digit line leakage reduces the margin Mreset.

In various embodiments, issues with set and reset margins can be addressed by compensating for the leakage contribution. The leakage current Ileak can be added to both Iref and Iclamp. In addition, the variation of Iref can be correlated with the variation of Iclamp to obtain a compensation of the reference variation.

Figure 4:
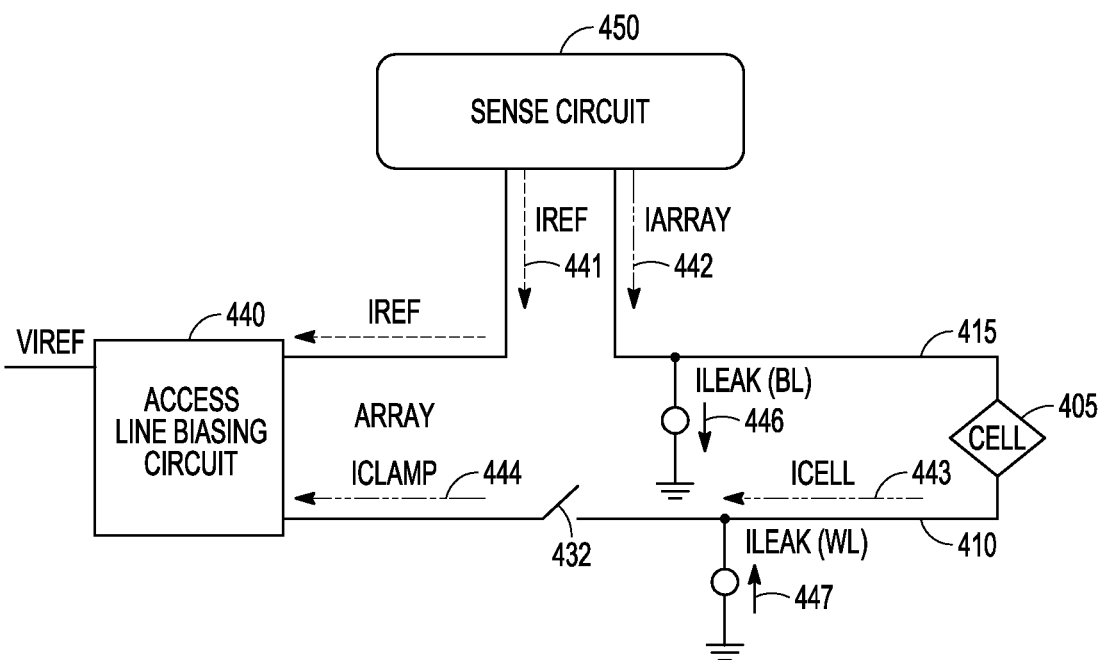
FIG. 4 illustrates an example arrangement of an access line bias circuit using a switch to drive an access line to a self-selecting memory cell in a memory array, with the self-selecting memory cell coupled to a digit line, according to various embodiments.

FIG. 4 illustrates an embodiment of an example arrangement of an access line bias circuit 440 using a switch 432 to drive an access line 410 to a SSM cell 405 in a memory array, with SSM cell 405 coupled to a digit line 415. The array current is the sum of Ileak(BL) 446 (due to digit line 415), Ileak(WL) 447 (due to access line 410), and cell current Icell 443. Access line bias circuit 440, with switch 432 closed, biases access line 410 with an appropriate voltage and sets Iclamp 444. Access line bias circuit 440 also creates Iref 441 for a sense circuit 450, i.e., from the negative side, while in conventional sensing the reference current for a sense circuit is generated from a different path. Iclamp 444 and Iref 441 can be obtained in access line bias circuit 440 from the same reference VIREF and are therefore correlated. In access line bias circuit 440, Iclamp 444 limits Icell 443 after snapback. The cell snapback during read causes an access line voltage drop that, in turn, cuts down the current leakage such that only the Iclamp flows in SSM cell 405.

Figure 5:
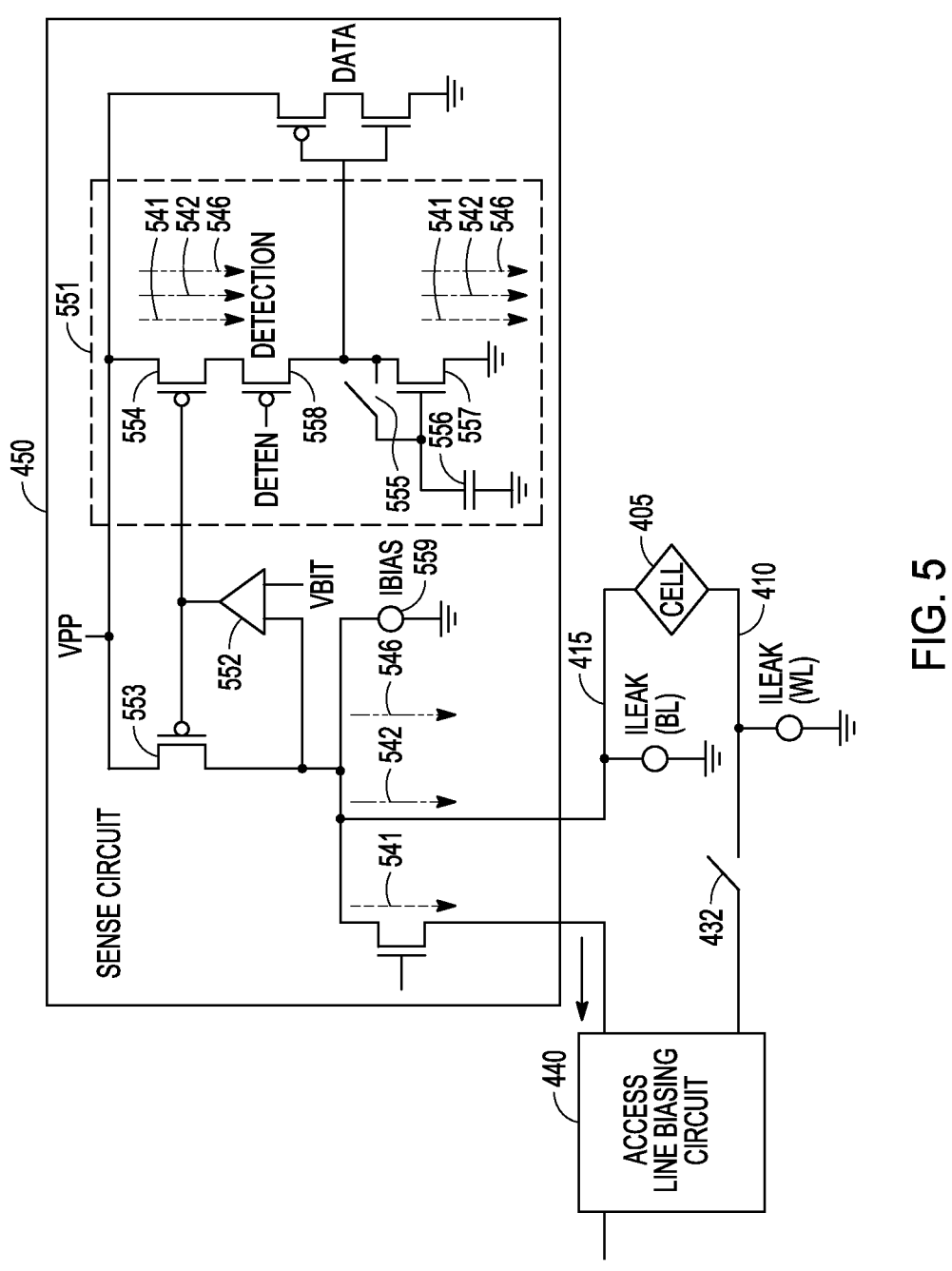
FIG. 5 illustrates example components for the sense circuit of FIG. 4 with respect to current flow in read operations with respect to the self-selecting memory cell coupled to the access line, according to various embodiments.

FIG. 5 illustrates an embodiment of example components for sense circuit 450 of FIG. 4 with respect to current flow in read operations with respect to SSM cell 405 coupled to access line 410. A read operation can be divided into two phases: a digit line precharge phase and an access line biasing phase. In the digit line precharge phase for the structure of FIG. 5, digit line 415 is biased to a desired voltage Vbit and Iref 541 generated by access line biasing circuit 440 is sampled in sense circuit 450. Comparison to voltage Vbit can be made using a difference amplifier 552, or other comparison device, in sense circuit 450. During the precharge with a switch 432 open between access line bias circuit 440 and access line 410, Iref 541, a leakage current 542, and a bias current Ibias 546 from bias source 559 are mirrored by a p-channel metal-oxide semiconductor (MOS) transistor 553 and a p-channel MOS transistor 554 using a p-channel MOS transistor 558, according to a detection signal, in a detector 551 of sense circuit 450. Leakage current 542 has contributions from Ileak(BL) due to digit line 415 and Ileak(WL) due to access line 410. A voltage on the gate of n-channel MOS transistor 557 is sampled on a capacitor 556 using a switch 555, where this combined current can later be used in comparison to provide data. Then in the access line biasing phase, Iref 541 is cut off and access line 410 to SSM cell 405 is biased with a target voltage.

Figure 6:
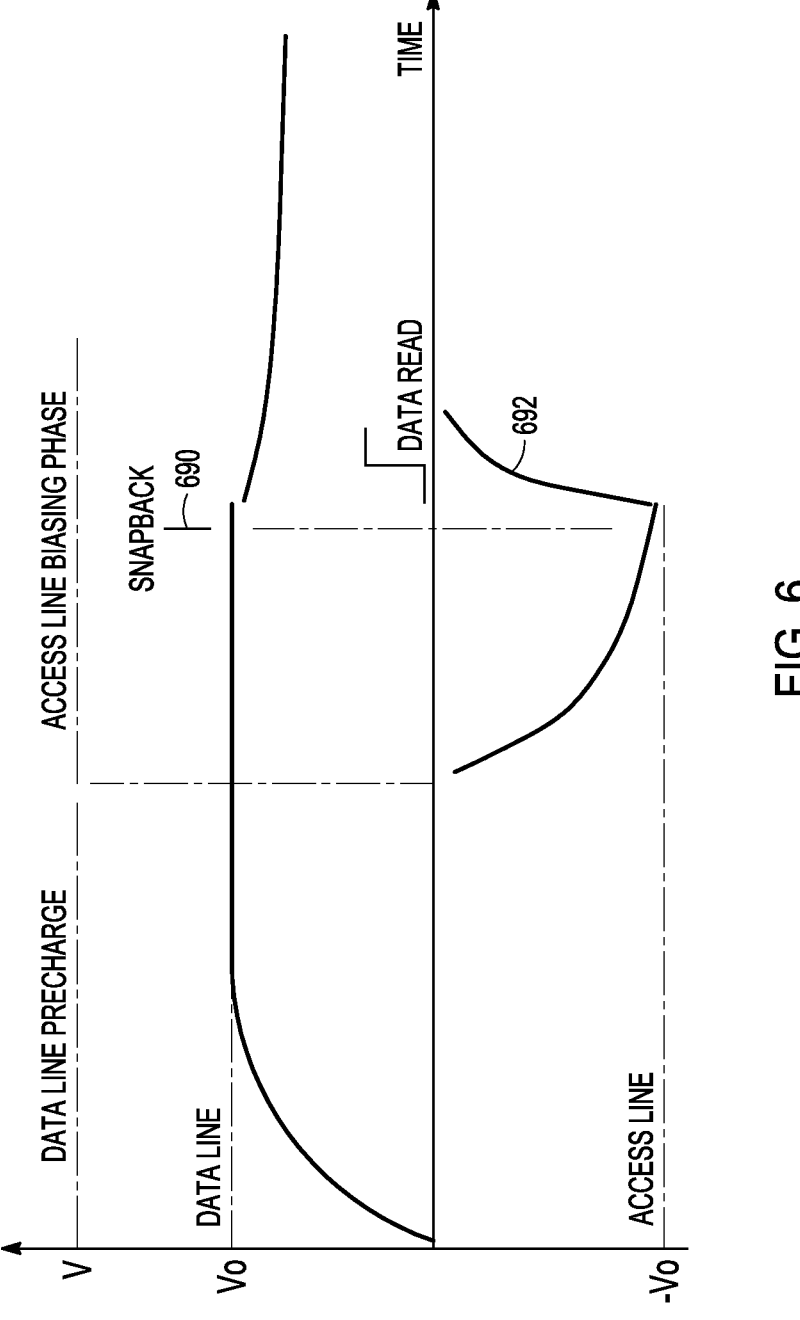
FIG. 6 illustrates a plot of voltage versus time for the digit line precharge phase and the access line biasing phase of FIG. 5, according to various embodiments.

FIG. 6 illustrates a plot of voltage versus time for the digit line precharge phase and the access line biasing phase of FIG. 5. Over time in the digit line precharge phase, voltage on the digit line is raised to the desired target voltage Vo. The voltage Vo on the digit line is maintained until snapback at 690, at which point the voltage on the digit lines begins decreasing. During the digit line precharge phase, there is no voltage on the access line. From the start of the access line biasing phase, voltage on the access line decreases until snapback at 690. Curve 692 shows that after snapback, the voltage of the access line drops and access line leakage moves towards an off state.

Figure 7:
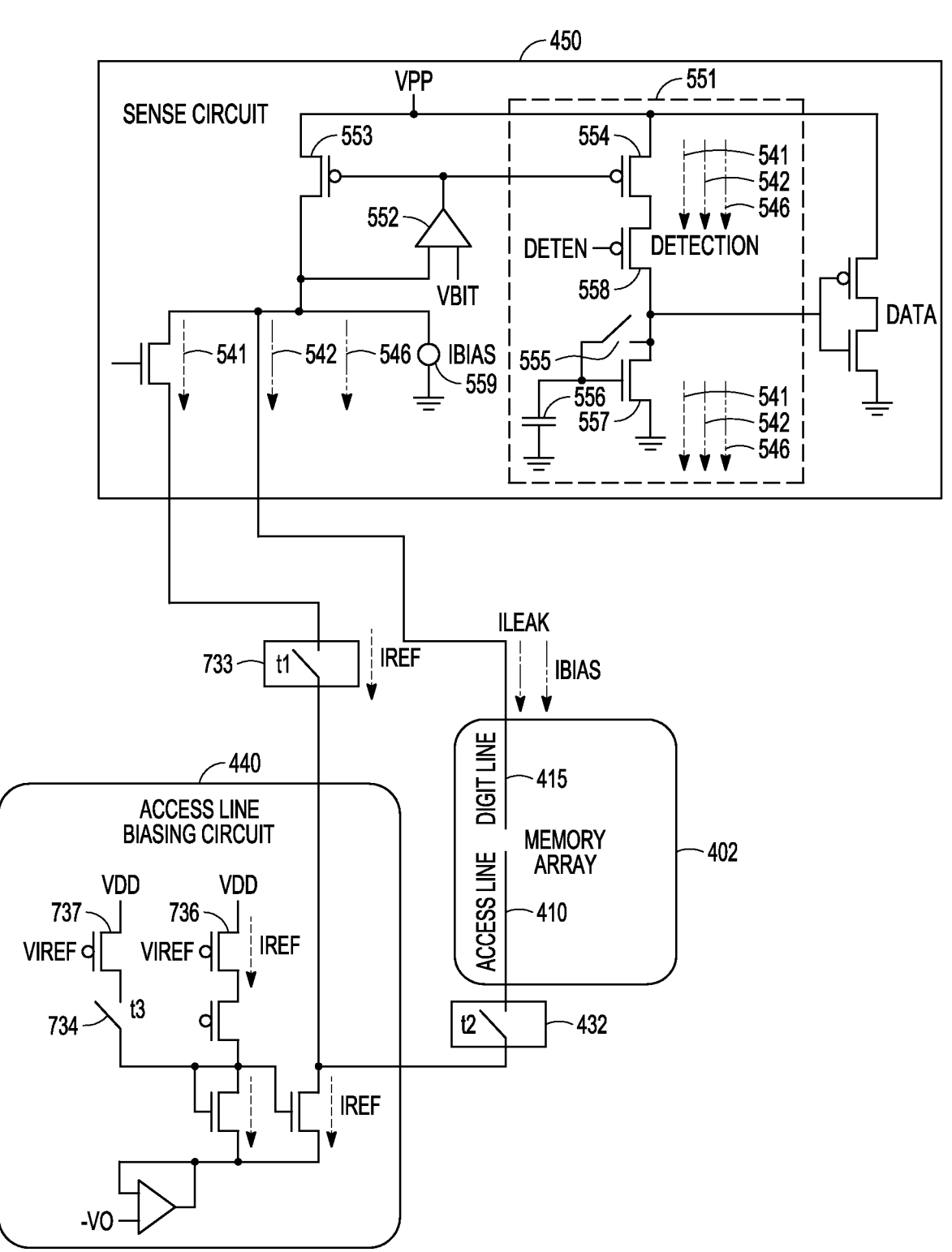
FIG. 7 illustrates example components for the access line biasing circuit of FIGS. 4 and 5 to operate with the sense circuit, according to various embodiments.

FIG. 7 illustrates an embodiment of example components for access line biasing circuit 440 of FIGS. 4 and 5 to operate with sense circuit 450. Access line biasing circuit 440 and sense circuit 450 can be operated in the digit line precharge phase and an access line biasing phase using a set of switches to control activities in a memory array 402, sense circuit 450, and access line biasing circuit 440. The set of switches include a first switch (t1) 733, a second switch (t2) 432, and a third switch (t3) 734. Access line biasing circuit 440 includes a first current generator 736 to provide a first reference current and a second current generator 737 to provide a second reference current. The first reference current and the second reference current can be used to provide a clamp current for a SSM cell of memory array 402. Switch 734 couples an output path of the second current generator 737 to an output path of the first current generator 736 with switch 734 positioned to a closed position during the bias of access line 410. First current generator 736 and second current generator 737 can have a common structure using a common reference voltage Viref for generating Iref.

Figure 8:
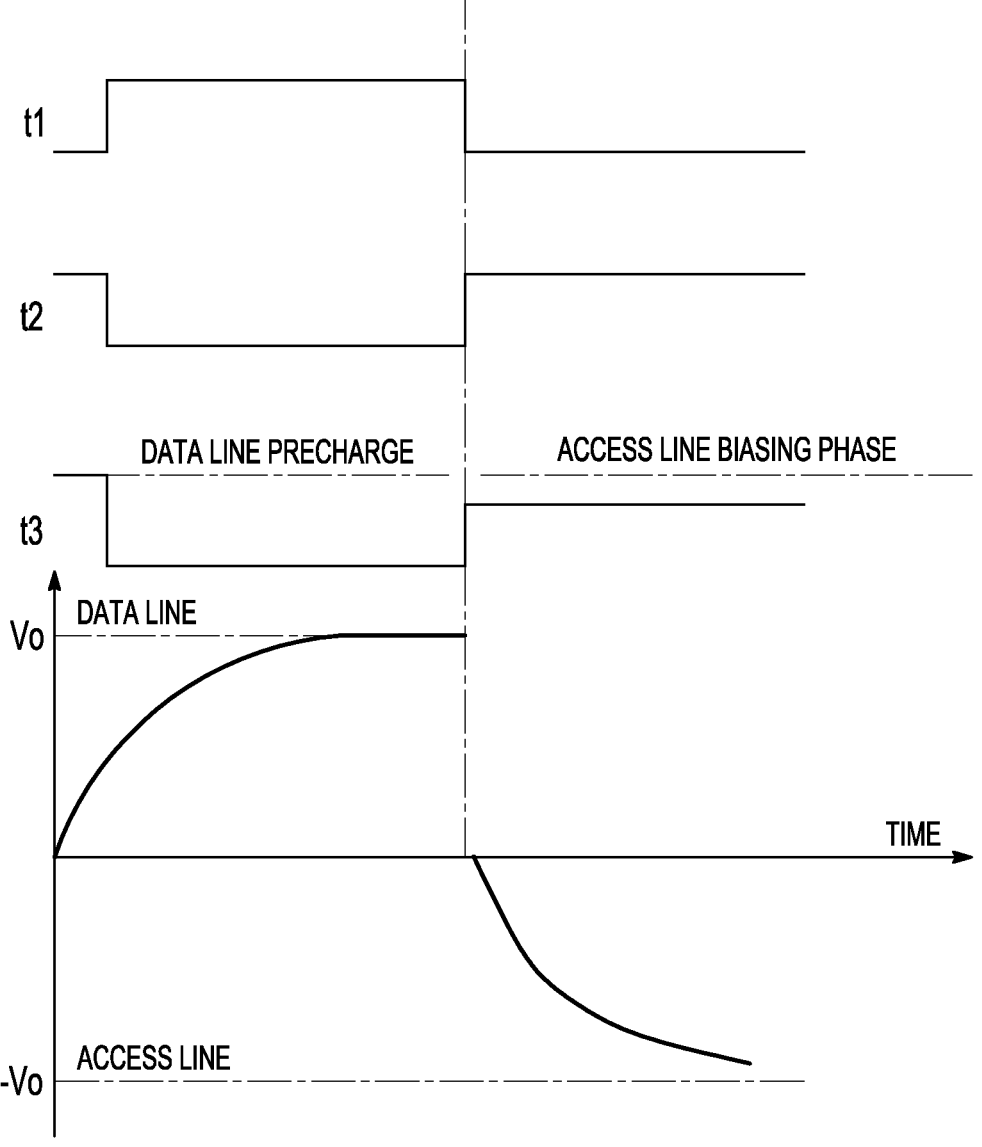
FIG. 8 is a timing diagram for the switches of FIG. 7 during the digit line precharge phase and access line biasing phase, according to various embodiments.

FIG. 8 is a timing diagram for switches 733, 432, and 734 of FIG. 7 during the digit line precharge phase and access line biasing phase. During the digit line precharge phase, switch 733 is closed, switch 432 is open, and switch 734 is open. With these switches in these positions, Iref is generated in access line biasing circuit 440, which is disconnected from access line 410 in this phase. This allows Iref 541+Ibias 546+Ileak 542 to be sampled inside detector 551 of sense circuit 450.

During the access line biasing phase, switch 733 is open, switch 432 is closed, and switch 734 is closed. With these switches in these positions, access line biasing circuit 440 biases access line 410. With first current generator 736 and second current generator 737 having a common structure using a common reference voltage Viref, the maximum current allowed (Iclamp) in the SSM cell coupled to digit line 415, access line 410 pair is equal to twice Iref.

Figure 9:
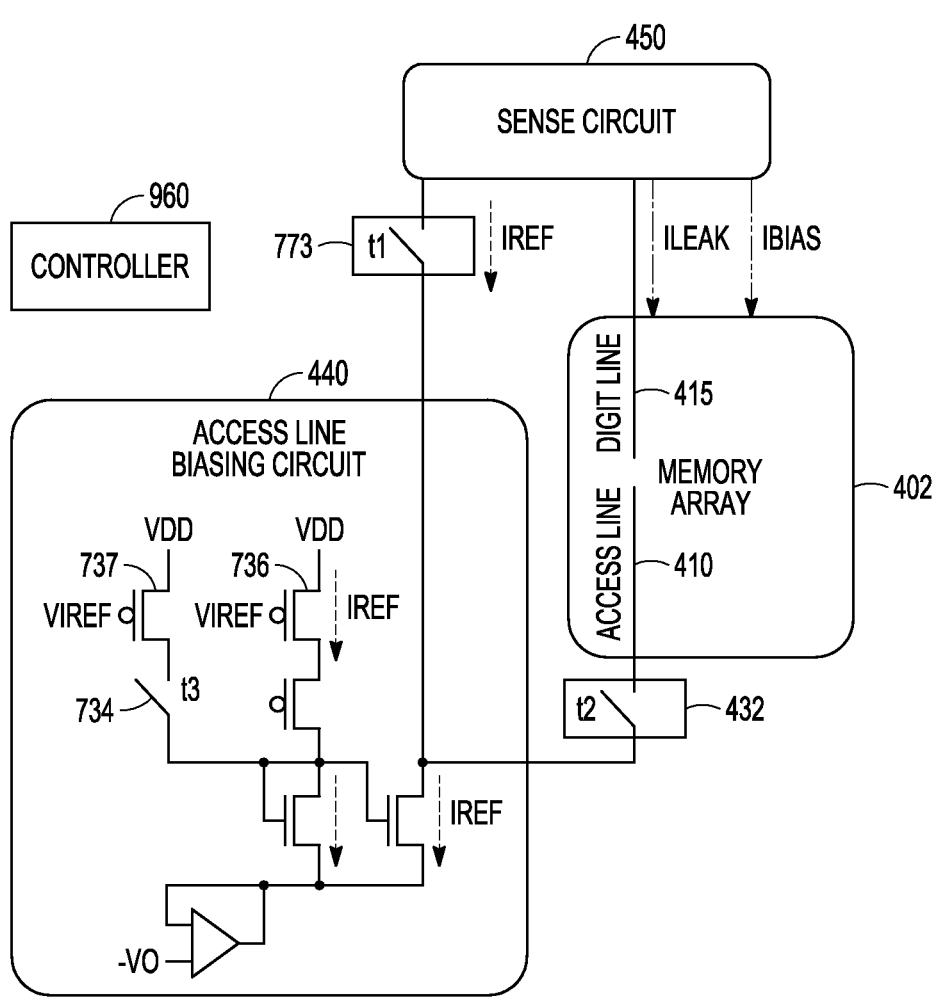
FIG. 9 illustrates an example controller that can be used to control switches to operate with the memory array, the access line biasing circuit, and the sense circuit of FIG. 7, according to various embodiments.

FIG. 9 illustrates an embodiment of an example controller 960 that can be used to control switches 733, 432, and 734 to operate with memory array 402, access line biasing circuit 440, and sense circuit 450 of FIG. 7. Controller 960 can be implemented as one or more processors to control the timing of switches 733, 432, and 734 with or in conjunction with stored instructions in components of the memory device containing switches 733, 432, and 734 to operate with memory array 402, access line biasing circuit 440, and sense circuit 450. Controller 960 can also be used to perform other functions of the memory device. Switches 733, 432, and 734 can be implemented in a number of different formats. For example, switches 733, 432, and 734 can be, but are not limited to, transistor switches.

With first current generator 736 and second current generator 737 having a common structure using a common reference voltage Viref, Iref and Iclamp are obtained from the same reference voltage Viref, which sets Iclamp equal to twice Iref. Moreover, as shown in FIG. 9, Iref and Iclamp flow in the same path, as both are generated by the same n-channel MOS in the access line biasing circuit 440 and both flow in the sense operation.

Figure 10:
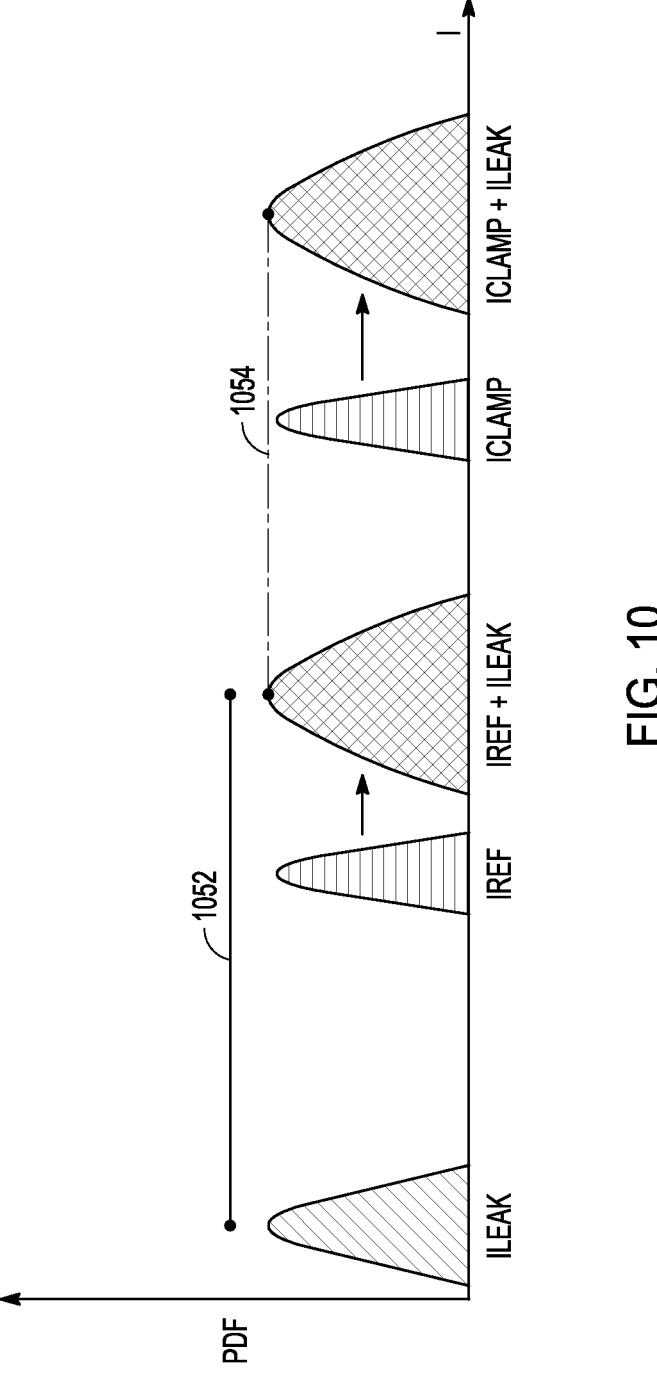
FIG. 10 illustrates adjustments of the margin for the set state and the margin for the set state of self-selecting memory cells of a memory device provided by the architecture of FIG. 9 as also discussed with respect to FIGS. 4, 5, and 7, according to various embodiments.

FIG. 10 illustrates adjustment of Mset and Mreset provided by the architecture of FIG. 9 as also discussed with respect to FIGS. 4, 5, and 7. As shown, Ileak is added to Iref during the sampling in the digit line precharge phase and continues to flow with Iclamp after the cell switching. As a result, the current read margins for set and reset are given by $$Mset = I(\text{set cell}) + Ileak - Iref - Ileak = Iclamp/2$$

$$Mreset = Iref - I(\text{reset cell}) = Iclamp/2 + Ileak - Ileak = Iclamp/2.$$

When the voltage on access line 410 drops, the leakage seen by access line 410 goes to zero. Now the two margins do not contain a leakage contribution, do not contain a high mismatch between Iref and Iclamp, are equal, and only depend on Iref.

The architecture for a sense circuit, an access line biasing circuit, and switches for controlling digit line precharge and access line biasing discussed in preceding figures were presented with respect to a single memory cell of the memory array of a memory device. Each memory cell of the memory device can be associated with a sense circuit, an access line biasing circuit, and switches. Each memory cell of such architectures can be coupled to and addressed by a unique pair of access line and digit line (access line, digit line). One or more controllers can be implemented to control each set of switches associated with each memory cell. With a reduced number of controllers used, multiplexers can be used to provide control signals to the sets of switches. Variations of the architecture may be implemented to provide a reference current for a sense circuit generated by an access line biasing circuit (access line driver), which is effectively from the negative side of the memory array. The access line biasing circuit can also provide a current claim that limits memory cell current after snapback. Variations of the architecture may be implemented to obtain the clamp current and the reference current in the access line biasing circuit using the same reference voltage such that the clamp current and the reference current are correlated.

FIG. 11 is a flow diagram of features of an embodiment of an example of a method 1100 of performing a read operation of a memory device having a memory array of resistive memory cells. A controller can be used in the execution of method 1100. The controller can be realized by one or more processors executing instructions stored in components of the memory device. At 1110, a first switch between a sense circuit of the memory device and an access line biasing circuit of the memory device is closed to provide a reference current to the sense circuit. At 1120, a second switch is opened, where the second switch couples the access line biasing circuit to an access line to a memory cell of the memory array. At 1130, a third switch is opened, where the third switch is configured in the access line biasing circuit to couple an additional current to a path of the reference current with the third switch closed. At 1140, a digit line coupled from the sense circuit to the memory cell is precharged. The precharging is implemented with the reference current provided to the sense circuit by operation of the access line biasing circuit. At 1150, the memory cell is sensed with the first switch open, the second switch closed, and the third switch closed. The memory cell is sensed after the memory cell is precharged.

Variations of method 1100 or methods similar to method 1100 can include a number of different embodiments that may be combined depending on the application of such methods and/or the architecture of systems in which such methods are implemented. Such methods can include sampling, in the sense circuit, a combination of the reference current, a bias current generated in the sense circuit, and a leakage current to the memory array during the precharging.

Variations of method 1100 or methods similar to method 1100 can include biasing the access line to the memory cell using the access line biasing circuit such that a maximum allowed current in the memory cell equals twice a value of the reference current. With the second switch and the third switch closed, a common voltage reference can be used to generate the reference current and the additional current to set a clamp current for the memory cell at twice the reference current.

Variations of method 1100 or methods similar to method 1100 can include operating the first switch, the second switch, and the third switch to provide a current read margin for a set operation of the memory device equal to a current read margin for a reset operation of the memory device. Variations can include operating the first switch, the second switch, and the third switch and applying a reference voltage in the access line biasing circuit such that the current read margin for the set operation and the current read margin for the reset operation do not contain a leakage contribution.

In various embodiments, a memory device can comprise a memory array of memory cells, where each memory cell is a resistive memory cell, a sense circuit coupled to the memory array, and an access line biasing circuit to control a clamp current for the memory cell of the memory array, with the clamp current being provided by the access line biasing circuit to the memory cell opposite the coupling of the sense circuit to the memory array. The memory device can include a set of switches to control activities in the memory array, the sense circuit, and the access line biasing circuit for a precharge phase of a digit line coupled to the memory cell and a sensing phase of the memory cell. Each memory cell of the memory array can be coupled to a unique pair of a digit line and an access line.

Variations of such a memory device and its features, as taught herein, can include a number of different embodiments and features that may be combined depending on the application of such memory devices, the format of such memory devices, and/or the architecture in which such memory devices are implemented. Features of such memory devices can include the access line biasing circuit having a first current generator to provide a first reference current obtained using a reference voltage and a second current generator to provide a second reference current obtained using the reference voltage, where the first reference current and the second reference current are implemented to provide the clamp current. In various embodiments, a current read margin for a set operation of the memory device can equal a current read margin for a reset operation of the memory device.

Variations of such a memory device can include the memory cells of the memory array disposed in a vertical three-dimensional structure with each resistive memory cell being a self-selecting memory cell coupled to a unique pair of a digit line and an access line. Other variations can include the memory cells of the memory array disposed in a planar structure with each resistive memory cell being a self-selecting memory cell coupled to a unique pair of a digit line and an access line.

In various embodiments, a memory device can comprise a memory array of memory cells, where each memory cell is a resistive memory cell, a sense circuit coupled to a digit line to a memory cell of the memory array, an access line biasing circuit coupled to the sense circuit and coupled to an access line to the memory cell, and a controller to control reading of the memory cell by a precharge of the digit line to the memory cell. The precharge of the digit line to the memory cell uses a reference current to the sense circuit from the access line biasing circuit. Following the precharge with the reference current to the sense circuit off, a bias of the access line to the memory cell by the access line biasing circuit includes setting of a maximum current allowed in the memory cell. In various embodiments, the maximum current can be twice the reference current.

Variations of such a memory device and its features, as taught herein, can include a number of different embodiments and features that may be combined depending on the application of such memory devices, the format of such memory devices, and/or the architecture in which such memory devices are implemented. Features of such memory devices can include the controller arranged to control a first switch coupling the access line biasing circuit to the sense circuit to provide the reference current with the first switch closed and to control a second switch coupling the access line biasing circuit to the access line to the memory cell to bias the access line with the second switch closed. Variations can include the access line biasing circuit having a first current generator and a second current generator with a switch coupling an output path of the second current generator to an output path of the first current generator and the controller arranged to control the switch to a closed position during the bias of the access line to the memory cell. The first current generator and the second current generator can have a common structure with a reference voltage coupled to the first current generator and the second current generator.

Variations of such a memory device can include the memory cells disposed in a planar structure with each resistive memory cell being a self-selecting memory cell coupled to a unique pair of a digit line and an access line. Variations of such a memory device can include the memory cells of the memory array disposed in a vertical three-dimensional structure with each resistive memory cell being a self-selecting memory cell coupled to a unique pair of a digit line and an access line. Multiple memory cells of the memory array in a vertical three-dimensional structure can be coupled to a conductive pillar to couple to the digit line of the unique pairs of the multiple memory cells. In such a vertical three-dimensional structure, the memory device can include a selector to control current flow between the conductive pillar and the digit line.

Figure 12:
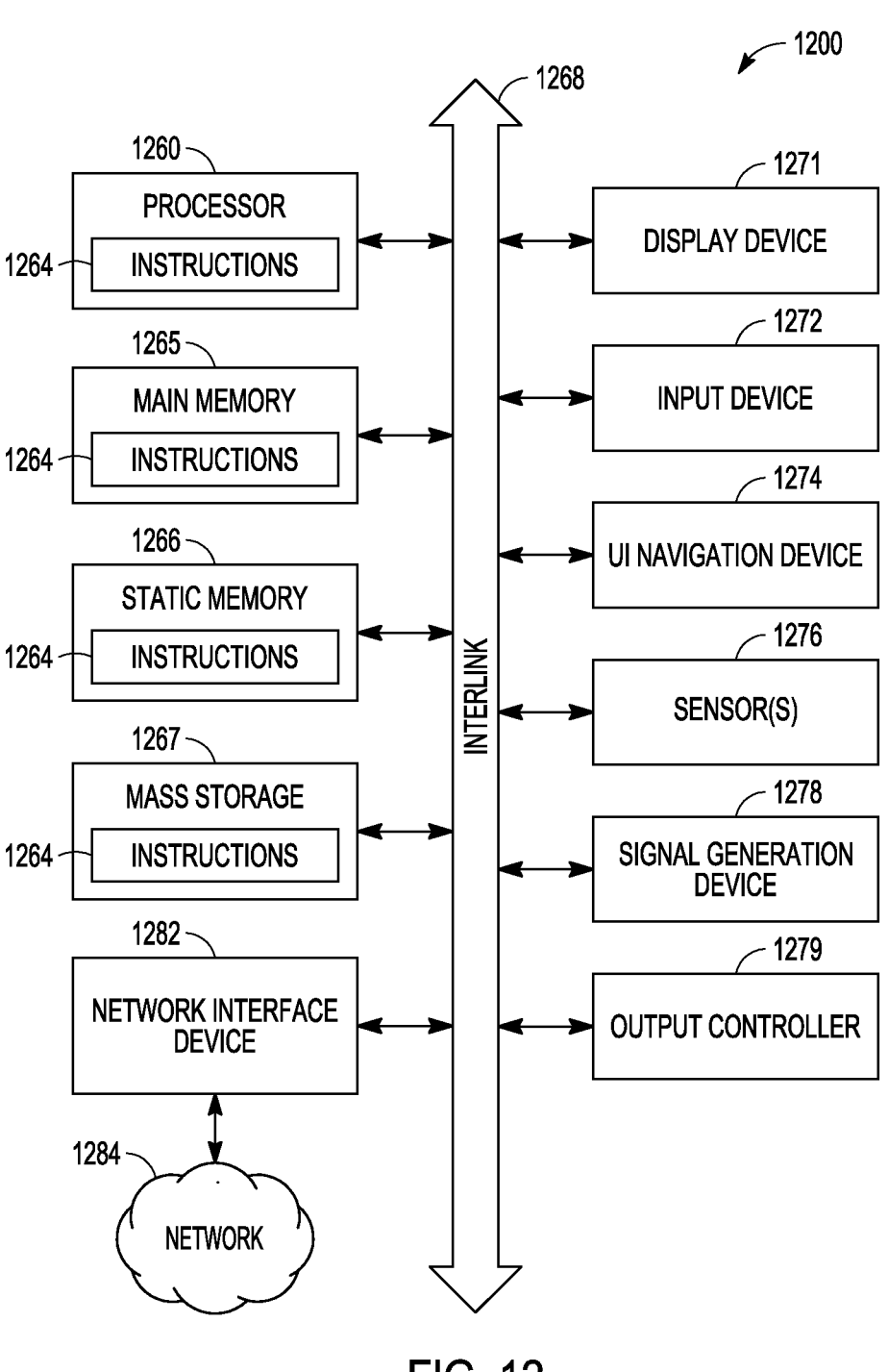
FIG. 12 is a block diagram illustrating an example of a machine upon which one or more embodiments may be implemented, according to various embodiments.

FIG. 12 is a block diagram of an embodiment of an example machine 1200 upon which any one or more of the techniques (e.g., methodologies) discussed herein may be performed to provide current references for resistive memory cells of a memory device for which a current read margin for a set operation of the memory cells and a current read margin for a reset operation of the memory cells essentially do not contain a leakage current contribution and essentially only depend on the current reference. The memory cells of the memory device can be arranged in a memory array having a planar structure or a vertical structure. In alternative embodiments, machine 1200 may operate as a standalone device or may be connected (e.g., networked) to other machines. In a networked deployment, machine 1200 may operate in the capacity of a server machine, a client machine, or both in server-client network environments. In an example, machine 1200 may act as a peer machine in peer-to-peer (P2P) (or other distributed) network environment. Machine 1200 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of methodologies to operate a memory device as discussed herein. The machine can be, but is not limited to, computing implementations such as cloud computing, software as a service (SaaS), other computer cluster configurations. The example machine 1200 can include one or more memory devices having structures as discussed herein.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent can be changed, for example, from an insulator to a conductor or vice versa. The instructions enable participating hardware (e.g., the execution units or a loading mechanism) to create members of the circuitry in hardware via variable connections to carry out portions of the specific tasks when in operation. Accordingly, the machine-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine 1200 can include one or more processors 1260, which can be a hardware processor such as, for example, a CPU, a GPU, a hardware processor core, or any combination thereof. Machine 1200 can include a main memory 1265 and a static memory 1266, some or all of which may communicate with each other via an interlink (e.g., bus) 1268. Machine 1200 can further include a display device 1271, an input device 1272, which can be an alphanumeric input device such as, for example, a keyboard) and a user interface (UI) navigation device 1274 (e.g., a mouse). In an example, display device 1271, input device 1272, and UI navigation device 1274 may be a touch screen display. Machine 1200 may additionally include a mass storage (e.g., drive unit) 1267, a signal generation device 1278 (e.g., a speaker), a network interface device 1282, and one or more sensors 1276, such as a global positioning system (GPS) sensor, compass, accelerometer, or other sensor. Machine 1200 may include an output controller 1279, such as a serial (e.g., USB, parallel, or other wired or wireless (e.g., infrared (IR), near field communication (NFC), etc.) connection to communicate or control one or more peripheral devices (e.g., a printer, card reader, etc.).

Machine 1200 may include a machine-readable medium, for example computer-readable medium, on which is stored one or more sets of data structures or instructions 1264 (e.g., software) embodying or utilized by any one or more of the techniques or functions described herein. Instructions 1264 may also reside, completely or at least partially, within main memory 1265, within static memory 1266, within mass storage 1267, or within one or more processors 1260 during execution thereof by machine 1200. In an example, one or any combination of one or more processors 1260, main memory 1265, static memory 1266, or mass storage 1267 may constitute the machine-readable medium. These memory types and data storage structures can include one or more memory devices structured as taught herein. While forms of the machine-readable medium are illustrated as a single medium, the term "machine-readable medium" may include a single medium or multiple media (e.g., a centralized or distributed database, or associated caches and servers) configured to store one or more instructions 1264.

The term "machine-readable medium" may include any medium that is capable of storing instructions for execution by machine 1200 and that cause machine 1200 to perform any one or more of the techniques for which machine 1200 is designed, or that is capable of storing data structures used by or associated with such instructions. Non-limiting machine-readable medium examples may include solid-state memories, optical media, and magnetic media. Specific examples of machine-readable media may include, but is not limited to, non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

Instructions 1264 (e.g., software, programs, an operating system (OS), etc.) or other data are stored on mass storage 1267, can be accessed by main memory 1265 for use by one or more processors 1260. Main memory 1265 (e.g., DRAM) is typically fast, but volatile, and thus a different type of storage than mass storage 1267 (e.g., an SSD), which is suitable for long-term storage, including while in an "off" condition. Instructions 1264 or data in use by a user or machine 1200 are typically loaded in main memory 1265 for use by one or more processors 1260. When main memory 1265 is full, virtual space from mass storage 1267 can be allocated to supplement main memory 1265; however, because mass storage 1267 is typically slower than main memory 1265, and write speeds are typically at least twice as slow as read speeds, use of virtual memory can greatly reduce user experience due to storage device latency (in contrast to main memory 1265, e.g., DRAM). Further, use of mass storage 1267 for virtual memory can greatly reduce the usable lifespan of mass storage 1267.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA-based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

Instructions 1264 may further be transmitted or received over a network 1284 using a transmission medium via network interface device 1282 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, network interface device 1282 may include one or more physical jacks (e.g., Ethernet, coaxial, or phone jacks) or one or more antennas to connect to network 1284. In an example, network interface device 1282 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions for execution by machine 1200 and includes instrumentalities to propagate digital or analog communications signals to facilitate communication of such software.

The following are example embodiments of devices and methods, in accordance with the teachings herein.

An example memory device 1 can comprise: a memory array of memory cells, each memory cell being a resistive memory cell; a sense circuit coupled to the memory array; and an access line biasing circuit to control a clamp current for the memory cell of the memory array, with the clamp current being provided by the access line biasing circuit to the memory cell opposite the coupling of the sense circuit to the memory array.

An example memory device 2 can include features of example memory device 1 and can include the access line biasing circuit having a first current generator to provide a first reference current obtained using a reference voltage and a second current generator to provide a second reference current obtained using the reference voltage, the first reference current and the second reference current to provide the clamp current.

An example memory device 3 can include features of any of the preceding example memory devices and can include the memory device having a set of switches to control activities in the memory array, the sense circuit, and the access line biasing circuit for a precharge phase of a digit line coupled to the memory cell and a sensing phase of the memory cell.

An example memory device 4 can include features of any of the preceding example memory devices and can include a current read margin for a set operation of the memory device equaling a current read margin for a reset operation of the memory device.

An example memory device 5 can include features of any of the preceding example memory devices and can include features of any of the preceding example memory devices and can include the memory cells of the memory array disposed in a vertical three-dimensional structure with each resistive memory cell being a self-selecting memory cell coupled to a unique pair of a digit line and an access line.

In an example memory device 6, any of the memory devices of example memory devices 1 to 5 may include memory devices incorporated into an electronic memory apparatus further comprising a host processor and a communication bus extending between the host processor and the memory device.

In an example memory device 7, any of the memory devices of example memory devices 1 to 6 may be modified to include any structure presented in another of example memory device 1 to 6.

In an example memory device 8, any of the memory devices of example memory devices 1 to 7 may be modified to include any structure presented in another of example memory device 1 to 7.

In an example memory device 9, any apparatus associated with the memory devices of example memory devices 1 to 8 may further include a machine-readable storage device configured to store instructions as a physical state, wherein the instructions may be used to perform one or more operations of the apparatus.

In an example memory device 10, any of the memory devices of example memory devices 1 to 9 may be operated in accordance with any of the methods of the below example methods 1 to 6.

An example memory device 11 can comprise a memory array of memory cells, each memory cell being a resistive memory cell; a sense circuit coupled to a digit line to a memory cell of the memory array; an access line biasing circuit coupled to the sense circuit and coupled to an access line to the memory cell; and a controller to control reading of the memory cell by a precharge of the digit line to the memory cell using a reference current to the sense circuit from the access line biasing circuit and, following the precharge with the reference current to the sense circuit off, a bias of the access line to the memory cell by the access line biasing circuit including setting of a maximum current allowed in the memory cell.

An example memory device 12 can include features of example memory device 11 and can include the controller arranged to control a first switch coupling the access line biasing circuit to the sense circuit to provide the reference current with the first switch closed and to control a second switch coupling the access line biasing circuit to the access line to the memory cell to bias the access line with the second switch closed.

An example memory device 13 can include features of memory device 12 and features of example memory device 12 and can include the access line biasing circuit having a first current generator and a second current generator with a switch coupling an output path of the second current generator to an output path of the first current generator and the controller is arranged to control the switch to a closed position during the bias of the access line to the memory cell.

An example memory device 14 can include features of memory device 13 and features of example memory devices 11 and 12 and can include the first current generator and the second current generator having a common structure with a reference voltage coupled to the first current generator and the second current generator.

An example memory device 15 can include features of any of the preceding example memory devices 11 to 14 and can include the maximum current being twice the reference current.

An example memory device 16 can include features of any of the preceding example memory devices 11 to 15 and can include the memory cells being disposed in a planar structure with each resistive memory cell being a self-selecting memory cell coupled to a unique pair of a digit line and an access line.

An example memory device 17 can include features of any of the preceding example memory devices 11 to 16 and can include the memory cells of the memory array being disposed in a vertical three-dimensional structure with each resistive memory cell being a self-selecting memory cell coupled to a unique pair of a digit line and an access line.

An example memory device 18 can include features of example memory device 17 and features of any of the preceding example memory devices 11 to 16 and can include multiple memory cells of the memory array being coupled to a conductive pillar to couple to the digit line of the unique pairs of the multiple memory cells.

An example memory device 19 can include features of example memory device 18 and features of any of the preceding example memory devices 11 to 17 and can include the memory device having a selector to control current flow between the conductive pillar and the digit line.

In an example memory device 20, any of the memory devices of example memory devices 11 to 19 may include memory devices incorporated into an electronic memory apparatus further comprising a host processor and a communication bus extending between the host processor and the memory device.

In an example memory device 21, any of the memory devices of example memory devices 11 to 20 may be modified to include any structure presented in another of example memory device 11 to 20.

In an example memory device 22, any of apparatus associated with the memory devices of example memory devices 11 to 21 may further include a machine-readable storage device configured to store instructions as a physical state, wherein the instructions may be used to perform one or more operations of the apparatus.

In an example memory device 23, any of the memory devices of example memory devices 11 to 22 may be operated in accordance with any of the methods of the following example methods 1 to 6.

An example method 1 can comprise performing a read operation of a memory device having a memory array of resistive memory cells, the read operation including: precharging a digit line coupled from a sense circuit of the memory device to a memory cell of the memory array, with a first switch between the sense circuit and an access line biasing circuit of the memory device closed to provide a reference current to the sense circuit, with a second switch open, the second switch coupling the access line biasing circuit to an access line to the memory cell, and with a third switch open, the third switch configured in the access line biasing circuit to couple an additional current to a path of the reference current with the third switch closed; and sensing the memory cell with the first switch open, the second switch closed, and the third switch closed.

An example method 2 can include features of example method 1 and can include sampling in the sense circuit a combination of the reference current, a bias current generated in the sense circuit, and a leakage current to the memory array during the precharging.

An example method 3 can include features of any of the preceding example methods and can include, with the second switch and the third switch closed, using a common voltage reference to generate the reference current and the additional current to set a clamp current for the memory cell at twice the reference current.

An example method 4 can include features of any of the preceding example methods and can include operating the first switch, the second switch, and the third switch to provide a current read margin for a set operation of the memory device equal to a current read margin for a reset operation of the memory device.

An example method 5 can include features of example method 4 and features of any of the preceding example methods and can include operating the first switch, the second switch, and the third switch and applying a reference voltage in the access line biasing circuit such that the current read margin for the set operation and the current read margin for the reset operation do not contain a leakage contribution.

An example method 6 can include features of example method 5 and features of any of the preceding example methods and can include biasing the access line to the memory cell using the access line biasing circuit such that a maximum allowed current in the memory cell equals twice a value of the reference current.

In an example method 7, any of the example methods 1 to 6 may be performed in an electronic memory apparatus further comprising a host processor and a communication bus extending between the host processor and the memory device.

In an example method 8, any of the example methods 1 to 7 may be modified to include operations set forth in any other of method examples 1 to 7.

In an example method 9, any of the example methods 1 to 8 may be implemented at least in part through use of instructions stored as a physical state in one or more machine-readable storage devices.

An example method 10 can include features of any of the preceding example methods 1 to 9 and can include performing functions associated with any features of example memory devices 1 to 23.

An example machine-readable storage device 1 storing instructions, that when executed by one or more processors, cause a machine to perform operations, can comprise instructions to perform functions associated with any features of example memory devices 1 to 10 and memory devices 11 to 23 or perform methods associated with any features of example methods 1 to 10.

In various examples, the components, controllers, processors, units, engines, or tables described herein can include, among other things, physical circuitry or firmware stored on a physical device. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, RAMs, ROMs, SSDs, UFS devices, eMMC devices, and the like.

Although specific embodiments have been illustrated and described herein, any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A memory device comprising:
an array of memory cells, each memory cell being a resistive memory cell;
a sense circuit coupled to the array; and
an access line biasing circuit to drive an access line coupled to a memory cell of the array, to control a clamp current for the memory cell of the array, and to control a reference current to the sense circuit.

2. The memory device of claim 1, wherein the memory device includes a set of switches arranged to add a leakage current to the reference current during sampling of a digit line to the memory cell of the array in a precharge phase and to continue flow of the leakage current with the clamp current after switching state of the memory cell.

3. The memory device of claim 1, wherein the access line biasing circuit includes a common reference voltage source for the clamp current and the reference current.

4. The memory device of claim 1, wherein the access line biasing circuit is coupled to the memory cell by a switch, the switch arranged to bias an access line to the memory cell such that the clamp current is set for the memory cell at least in part in response to the switch in a closed position.

5. The memory device of claim 1, wherein the sense circuit includes a difference amplifier having an input from a digit line coupled to the memory cell and an input from a voltage source to compare voltage of the digit line to voltage of the voltage source.

6. The memory device of claim 1, wherein the sense circuit includes:

a current mirror to mirror a combined current of the reference current, a leakage current, and
a bias current from a bias source during precharge of a digit line to the memory cell; and
a capacitor arranged to sample the combined current in a comparison to provide data.

7. The memory device of claim 1, wherein a current read margin for a set operation of the memory device equals a current read margin for a reset operation of the memory device.

8. A memory device comprising:
an array of memory cells, the array including a memory cell structured as a resistive memory cell;
a sense circuit coupled to a digit line, the digit line coupled to the memory cell;
an access line biasing circuit;
a first switch coupling the sense circuit to the access line biasing circuit; and
a second switch coupling the access line biasing circuit to an access line to the memory cell, the access line biasing circuit structured to control a clamp current for the memory cell and to control a reference current to the sense circuit.

9. The memory device of claim 8, wherein the access line biasing circuit includes a first current generator to generate a first reference current and a second generator to generate a second reference current.

10. The memory device of claim 9, wherein the first current generator and the second current generator are structured to generate a same reference current and provide the clamp current equal to twice the same reference current.

11. The memory device of claim 10, wherein the access line biasing circuit includes a third switch to couple an output path from the first generator to an output path from the second generator to provide twice the same reference current to the access line with the second switch closed.

12. The memory device of claim 8, wherein the sense circuit includes:
a current bias source to generate a bias current in the sense circuit;
a difference amplifier having a first input coupled to an output of the current bias source and having a second input coupled to a voltage source; and
a detector coupled to the output of the difference amplifier, the detector arranged to sample a combined current of the reference current, a leakage current, and the bias current with the first switch closed and the second switch open.

13. The memory device of claim 12, wherein the detector includes a first p-channel transistor, with a gate of the first p-channel transistor coupled to a gate of a second p-channel transistor at the output of the difference amplifier to mirror the combined current of the reference current, a leakage current, and the bias current such that comparison of the combined current provides data.

14. A memory device comprising:
an array of memory cells, the array including a memory cell structured as a resistive memory cell;
a sense circuit coupled to a digit line, the digit line coupled to the memory cell;
an access line biasing circuit;
a first switch coupling the sense circuit to the access line biasing circuit;
a second switch coupling the access line biasing circuit to an access line to the memory cell, the access line biasing circuit structured to control a clamp current for the memory cell and to control a reference current to the sense circuit; and a controller to control a digit line precharge phase and an access line biasing phase of a read operation of the memory cell via the first switch and the second switch.

15. The memory device of claim 14, wherein the controller is arranged to control the first switch to provide the reference current with the first switch closed and the second switch open in the digit line precharge phase.

16. The memory device of claim 15, wherein the controller is arranged to control a third switch between an output path of a first current generator in the access line biasing circuit and an output path of a second current generator in the access line biasing circuit, the third switch open in the digit line precharge phase.

17. The memory device of claim 14, wherein the controller is arranged to close the second switch and to open the first switch in the access line biasing phase.

18. The memory device of claim 17, wherein the controller is arranged to control a third switch between an output path of a first current generator in the access line biasing circuit and an output path of a second current generator in the access line biasing circuit, the third switch closed in the access line biasing phase.

19. The memory device of claim 18, wherein the access line biasing circuit is arranged to provide the clamp current with the second switch closed and the third switch closed, the clamp current being a combination of current from the first current generator and current from the second current generator.

20. The memory device of claim 19, wherein the first current generator and the second current generator have a common structure.

* * * * *